United States Patent
Hur et al.

(10) Patent No.: US 11,024,659 B2
(45) Date of Patent: Jun. 1, 2021

(54) IMAGE SENSOR AND METHOD OF FABRICATING THE SAME

(71) Applicant: SAMSUNG ELECTRONICS CO., LTD., Suwon-si (KR)

(72) Inventors: Jaesung Hur, Yongin-si (KR); Youngtak Kim, Hwaseong-si (KR); Hajin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/555,151

(22) Filed: Aug. 29, 2019

(65) Prior Publication Data

US 2020/0219920 A1    Jul. 9, 2020

(30) Foreign Application Priority Data

Jan. 3, 2019  (KR) ........................ 10-2019-0000914

(51) Int. Cl.
*H01L 27/146*    (2006.01)

(52) U.S. Cl.
CPC .. *H01L 27/14621* (2013.01); *H01L 27/14623* (2013.01); *H01L 27/14627* (2013.01); *H01L 27/14643* (2013.01); *H01L 27/14685* (2013.01)

(58) Field of Classification Search
CPC .............................................. H01L 27/14621
See application file for complete search history.

(56) References Cited

U.S. PATENT DOCUMENTS

| | | | |
|---|---|---|---|
| 7,907,237 B2 | 3/2011 | Maeda et al. | |
| 9,064,986 B2 | 6/2015 | Wang et al. | |
| 9,093,579 B2 | 7/2015 | Mackey et al. | |
| 9,356,069 B2 | 5/2016 | Wang et al. | |
| 9,812,485 B2 | 11/2017 | Suzuki | |
| 10,014,338 B2 | 7/2018 | Lee | |
| 10,103,194 B2 | 10/2018 | Wang et al. | |
| 2014/0339606 A1 | 11/2014 | Lin et al. | |
| 2014/0339665 A1 | 11/2014 | Tani | |
| 2015/0276175 A1* | 10/2015 | Moriya | H01L 27/322 349/61 |
| 2017/0356611 A1 | 12/2017 | Vasylyev | |
| 2018/0076247 A1 | 3/2018 | Pang et al. | |
| 2018/0090538 A1 | 3/2018 | Wang et al. | |
| 2018/0190707 A1* | 7/2018 | Lee | H01L 27/14645 |
| 2018/0301491 A1* | 10/2018 | Nakamoto | H01L 27/1463 |

FOREIGN PATENT DOCUMENTS

JP    2012-204387 A    10/2012

* cited by examiner

*Primary Examiner* — Moazzam Hossain
*Assistant Examiner* — Mohammad A Rahman
(74) *Attorney, Agent, or Firm* — Lee IP Law, P.C.

(57) ABSTRACT

An image sensor and a method of fabricating an image sensor are provided, the image sensor including a plurality of color filters spaced apart from each other on a semiconductor substrate; a protective layer covering sidewalls of the color filters and top surfaces of the color filters; and a low-refractive pattern filling a space between the color filters.

19 Claims, 13 Drawing Sheets

IMAGE SENSOR AND METHOD OF FABRICATING THE SAME

CROSS-REFERENCE TO RELATED APPLICATION

Korean Patent Application No. 10-2019-0000914, filed on Jan. 3, 2019, in the Korean Intellectual Property Office, and entitled: "Image Sensor and Method of Fabricating the Same," is incorporated by reference herein in its entirety.

BACKGROUND

1. Field

Embodiments relate to an image sensor and a method of fabricating the same.

2. Description of the Related Art

An image sensor is a semiconductor device to convert optical images into electrical signals. An image sensor may be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

The embodiments may be realized by providing an image sensor including a plurality of color filters spaced apart from each other on a semiconductor substrate; a protective layer covering sidewalls and top surfaces of the color filters; and a low-refractive pattern filling a space between the color filters.

The embodiments may be realized by providing an image sensor including a semiconductor substrate having a plurality of unit pixel areas; a deep device isolation section between the unit pixel areas; a photoelectric conversion section in the semiconductor substrate of each of the unit pixel areas; a plurality of color filters spaced apart from each other on the semiconductor substrate; a light-shield pattern on the semiconductor substrate and between the color filters, the light-shield pattern having a thickness that is less than a thickness of the color filter; a low-refractive pattern filling a space between the color filters; and a protective layer between the low-refractive pattern and the color filters and between the low-refractive pattern and the light-shield pattern.

The embodiments may be realized by providing an image sensor including a plurality of optical filters spaced apart from each other on a semiconductor substrate; a low-refractive pattern filling a space between the optical filters; and a light-shield pattern between the low-refractive pattern and the semiconductor substrate.

The embodiments may be realized by providing a method of fabricating an image sensor, the method including forming a plurality of sacrificial patterns on a semiconductor substrate to define a plurality of color filter regions; forming a plurality of color filters in the color filter regions, respectively; and replacing the sacrificial patterns with low-refractive patterns.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
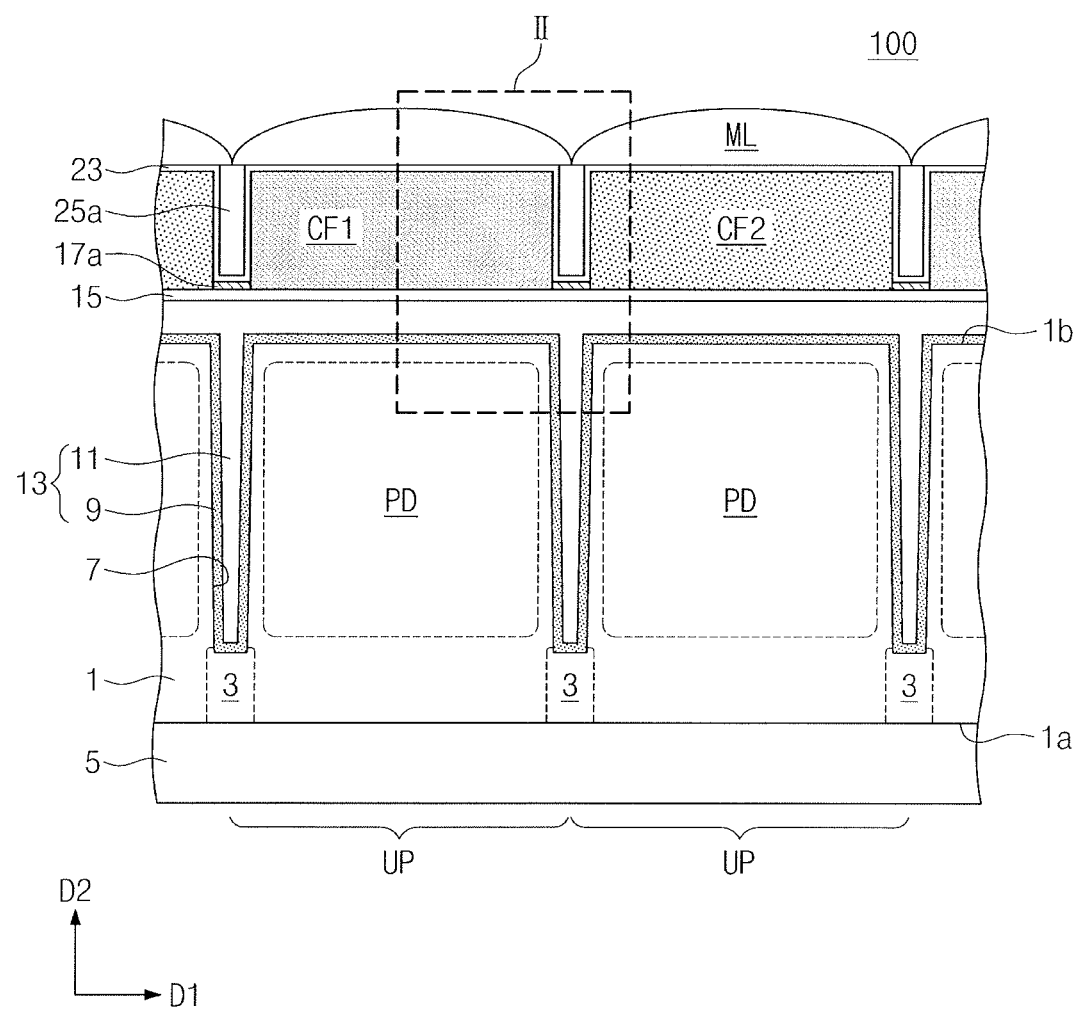
FIG. 1 illustrates a cross-sectional view of an image sensor according to some example embodiments.
Figure 2A:
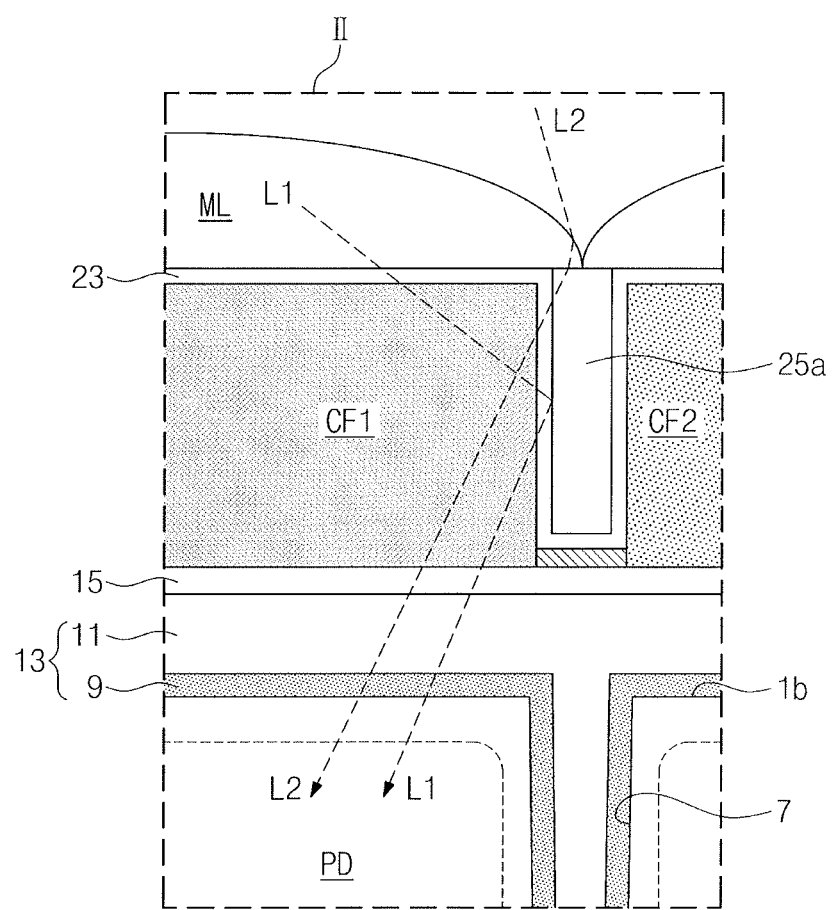
FIGS. 2A and 2B illustrate enlarged views of section II of FIG. 1.
Figure 2B:
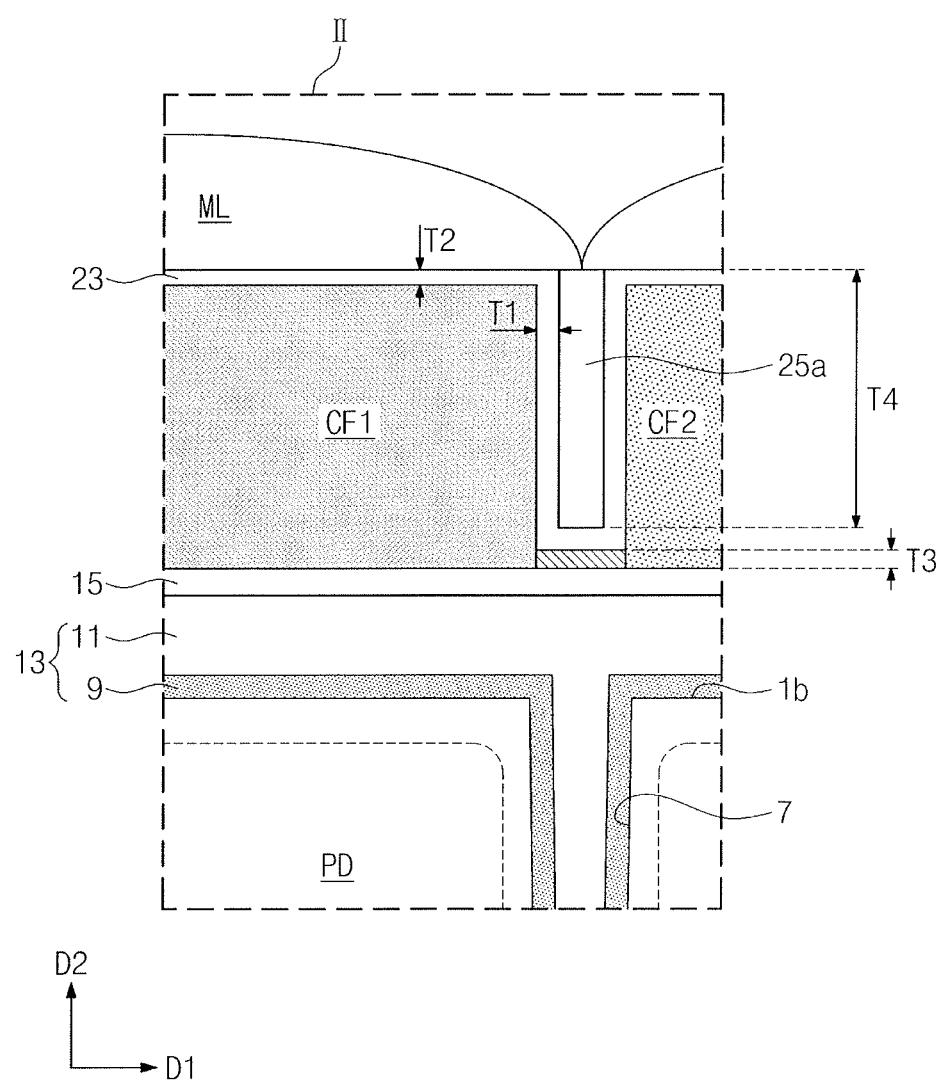

FIG. 1 illustrates a cross-sectional view of an image sensor according to some example embodiments. FIGS. 2A and 2B illustrate enlarged views of section II of FIG. 1.

Referring to FIGS. 1, 2A, and 2B, an image sensor 100 according to the present embodiment may include a semiconductor substrate 1. The semiconductor substrate 1 may be a single crystalline silicon wafer or an epitaxial silicon layer. The semiconductor substrate 1 may be doped with impurities having a first conductive type. In an implementation, the first conductive type may be p-type, and the impurities may be boron. The semiconductor substrate 1 may have a first surface 1a and a second surface 1b that face each other along a second direction D2.

The semiconductor substrate 1 may include a plurality of unit pixel areas UP. The semiconductor substrate 1 may be provided with a deep device isolation section 13 that separates the unit pixel areas UP from each other along a first direction D1. The deep device isolation section 13 may be in a deep trench 7. The deep trench 7 may extend from the second surface 1b toward the first surface 1a. The deep trench 7 may have a width that decreases as the deep trench 7 approaches the first surface 1a from the second surface 1b (e.g., in a depth direction). The deep device isolation section 13 may include a fixed charge layer 9 (conformally covering a sidewall of the deep trench 7) and a buried dielectric layer 11 (filling, e.g., remaining portions of, the deep trench 7).

The fixed charge layer 9 may have a negative fixed charge. The fixed charge layer 9 may include a metal oxide or a metal fluoride that includes, e.g., hafnium (Hf), zirconium (Zr), aluminum (Al), tantalum (Ta), titanium (Ti), yttrium (Y), or a lanthanide. For example, the fixed charge layer 9 may be a hafnium oxide layer or an aluminum oxide layer. Hole accumulation may occur around the fixed charge layer 9. Therefore, dark current and white spots may be effectively reduced. The buried dielectric layer 11 may be formed of a dielectric layer with excellent step coverage, e.g., a silicon oxide layer. In an implementation, the deep device isolation section 13 may have a grid shape viewed in a plan view. The fixed charge layer 9 may extend onto and contact the second surface 1b. The buried dielectric layer 11 may also extend onto the second surface 1b along the first direction D1.

In an implementation, a photoelectric conversion section PD may be in the semiconductor substrate 1 on or at each of the unit pixel areas UP (limited by the deep device isolation section 13). The photoelectric conversion section PD may be a region doped with impurities having a second conductive type that is opposite to the first conductive type. For example, the photoelectric conversion section PD may be doped with n-type arsenic or phosphorous. The photoelectric conversion section PD and the semiconductor substrate 1 therearound may form a p-n junction to constitute a photodiode.

In an implementation, the semiconductor substrate 1 may include, e.g., on its first surface 1a, a transfer transistor, a reset transistor, a source follower transistor, and a select transistor through which are transferred charges generated from the photoelectric conversion section PD. In an implementation, the first surface 1a of the semiconductor substrate 1 may be covered with an interlayer dielectric layer 5. The interlayer dielectric layer 5 may have a single layer structure or a multiple layer structure that includes one or more of a silicon oxide layer, a silicon oxynitride layer, and/or a silicon nitride layer. In an implementation, a plurality of connection lines may be in the interlayer dielectric layer 5.

The semiconductor substrate 1 may include a device isolation region 3 therein that adjoins, e.g., directly contacts, the first surface 1a and overlaps the deep device isolation section 13 along the second direction D2. The device isolation region 3 may be doped with impurities having the first conductive type. A concentration of the first conductive type impurities doped in the device isolation region 3 may be greater than a concentration of the first conductive type impurities doped in the semiconductor substrate 1.

A subsidiary dielectric layer 15 may be on the buried dielectric layer 11 on the second surface 1b of the semiconductor substrate 1. The subsidiary dielectric layer 15 may include one or more of an antireflection layer or a planarization layer. The subsidiary dielectric layer 15 may include one or more of a silicon nitride layer or an organic dielectric layer.

The subsidiary dielectric layer 15 may include first color filters CF1 and second color filters CF2 alternately arranged thereon along the first direction D1. The first color filters CF1 and the second color filters CF2 may have island shapes spaced apart from each other, e.g., completely spaced apart such that the color filters CF1 and CF2 have island shapes in a plan view. The first color filters CF1 and the second color filters CF2 may be between low-refractive patterns 25a arranged in a grid shape in a plan view. The first color filters CF1 and the second color filters CF2 may include dyes or pigments whose colors are different from each other. The first color filters CF1 and the second color filters CF2 may filter light having a specific wavelength. The first color filters CF1 and the second color filters CF2 may also be called optical filters. In an implementation, the first color filters CF1 and the second color filters CF2 may be infrared filters.

A protective layer 23 may cover sidewalls and top surfaces (e.g., surfaces facing away from the semiconductor substrate 1) of the first color filters CF1 and of the second color filters CF2. The protective layer 23 may have a single layer structure or a multiple layer structure. The protective layer 23 may include one or more of an aluminum oxide layer and a silicon oxycarbide layer (e.g., a single layer of aluminum oxide, a single layer of silicon oxycarbide, a multilayer structure including an aluminum oxide layer, a multilayer structure including a silicon oxycarbide layer, or a multilayer structure including an aluminum oxide layer and a silicon oxycarbide layer).

As shown in FIG. 2B, a portion of the protective layer 23 on the sidewalls of the first color filters CF1 and the second color filters CF2 may have a first thickness T1 along the first direction D1 and a portion of the protective layer 23 on the top surfaces of the first color filters CF1 and the second color filters CF2 may have a second thickness T2 along the second direction D2. The first thickness T1 may be equal to or greater than the second thickness T2. The protective layer 23 may have a thickness of, e.g., about 1 Å to about 100 Å. In an implementation, the first thickness T1 may be, e.g., about 1 Å to about 100 Å. The protective layer 23 may protect the first color filters CF1 and the second color filters CF2 against damage and moisture absorption. As a result, the image sensor 100 may increase in reliability.

A light-shield pattern 17a may be on the subsidiary dielectric layer 15 and between the first color filters CF1 and the second color filters CF2. The light-shield pattern 17a may have a grid shape when in a plan view. In an implementation, the light-shield pattern 17a may include, e.g., titanium. The light-shield pattern 17a may have a third thickness T3 along the second direction D2. The light-shield pattern 17a may have a sidewall aligned with that of an adjacent one of the first color filters CF1 and the second color filters CF2. The light-shield pattern 17a may help prevent bruise defects (e.g., images are partially seen blue), which may result in achievement of sharp image quality.

A low-refractive pattern 25a may fill a space between the first color filters CF1 and the second color filters CF2. The low-refractive pattern 25a may have a refractive index that is less than those of the first color filters CF1 and the second color filters CF2. The refractive index of the low-refractive pattern 25a may be, e.g., equal to or less than about 1.3. The low-refractive pattern 25a may include an organic material. The low-refractive pattern 25a may have a fourth thickness T4 along the second direction D2. The fourth thickness T4 may be greater than the third thickness T3. The protective layer 23 may be between the low-refractive pattern 25a and the first color filters CF1 and the second color filters CF2 and between the low-refractive pattern 25a and the light-shield pattern 17a. The low-refractive pattern 25a may have a top surface that is coplanar with that of the protective layer 23. The low-refractive pattern 25a may have a width along the first direction D1 that is less than that of the light-shield pattern 17a. The low-refractive pattern 25a and the light-shield pattern 17a may vertically overlap the deep device isolation section 13.

Micro-lenses ML may be on the protective layer 23. The micro-lenses ML may overlap corresponding ones of the first color filters CF1 and of the second color filters CF2 along the second direction D2. The micro-lenses ML may each contact, e.g., directly contact, the top surfaces of the protective layer 23 and the low-refractive pattern 25a.

In the image sensor 100 according to the present embodiment, the low-refractive pattern 25a may have a refractive index that is less than those of the first color filters CF1 and the second color filters CF2. Therefore, when a first light L1 is incident adjacently on edges of the first color filters CF1 and the second color filters CF2, the first light L1 may be refracted from a surface of the low-refractive patterns 25a and then may travel to the photoelectric conversion section PD on a related unit pixel area UP. Furthermore, the low-refractive pattern 25a may have a refractive index equal to or less than about 1.3, and when a second light L2 is incident onto the top surface of the low-refractive pattern 25a, the second light L2 may be refracted from the top surface of the low-refractive pattern 25a and then may travel to the photoelectric conversion section PD on a related unit pixel area UP.

The photoelectric conversion section PD may thus receive an increased amount of light incident thereon, which may result in an increase in light-receiving efficiency, and in turn, may result in an improvement in luminance efficiency. As a result, a signal-to-noise ratio (SNR) may be raised. The protective layer 23 may have a small thickness equal to or less than about 100 Å between the low-refractive pattern 25a and the first color filters CF1 and the second color filters CF2, and accordingly may have little to no effect on pathways of the first light L1 and the second light L2.

FIGS. 3A to 3G illustrate cross-sectional views of stages in a method of fabricating the image sensor of FIG. 1, according to some example embodiments.

Figure 3A:
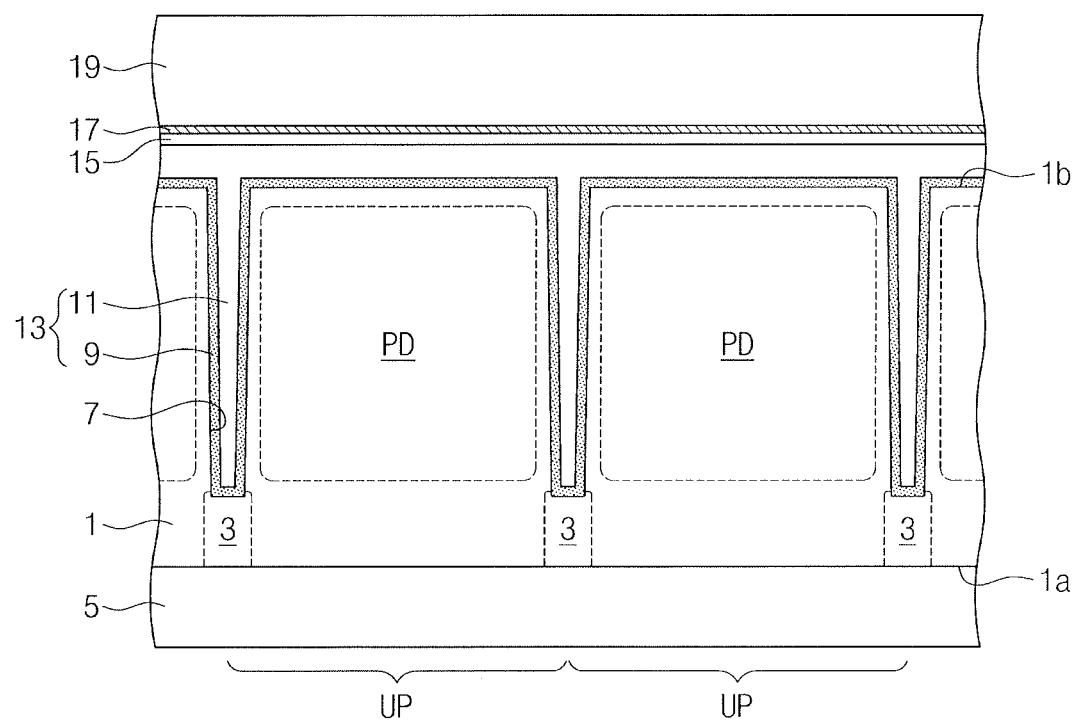
FIGS. 3A to 3G illustrate cross-sectional views of stages in a method of fabricating the image sensor of FIG. 1, according to some example.

Referring to FIG. 3A, a semiconductor substrate 1 may be prepared that has a first surface 1a and a second surface 1b that face each other. An ion implantation process may be performed to form, in the semiconductor substrate 1, a device isolation region 3 to adjoin the first surface 1a. A photoelectric conversion section PD may be formed in the semiconductor substrate 1. In an implementation, transistors may be formed on the semiconductor substrate 1. An interlayer dielectric layer 5 may be formed to cover the first surface 1a of the semiconductor substrate 1. In an implementation, multi-layered connection lines may be formed in the interlayer dielectric layer 5.

The semiconductor substrate 1 may be etched from the second surface 1b toward the first surface 1a along the second direction D2 to form a deep trench 7. A fixed charge layer 9 may be conformally formed on an entirety of the second surface 1b to cover a sidewall and a bottom surface of the deep trench 7, and a buried dielectric layer 11 may be formed to fill, e.g., the rest of, the deep trench 7. Thus, the deep trench 7 may be provided therein with a deep device isolation section 13 including the fixed charge layer 9 and the buried dielectric layer 11. A subsidiary dielectric layer 15 may be formed on the buried dielectric layer 11.

A light-shield layer 17 and a sacrificial layer 19 may be sequentially stacked on the subsidiary dielectric layer 15 along the second direction D2. In an implementation, the light-shield layer 17 may be formed of, e.g., titanium. The sacrificial layer 19 may be formed of, e.g., one or more of a silicon oxide layer, a silicon nitride layer, a silicon oxynitride layer, or the like, using a deposition process, e.g., chemical vapor deposition, physical vapor deposition, or the like. The sacrificial layer 19 may be formed to have a thickness suitable for optical characteristics of first and second color filters CF1 and CF2, which will be discussed below.

Figure 3B:
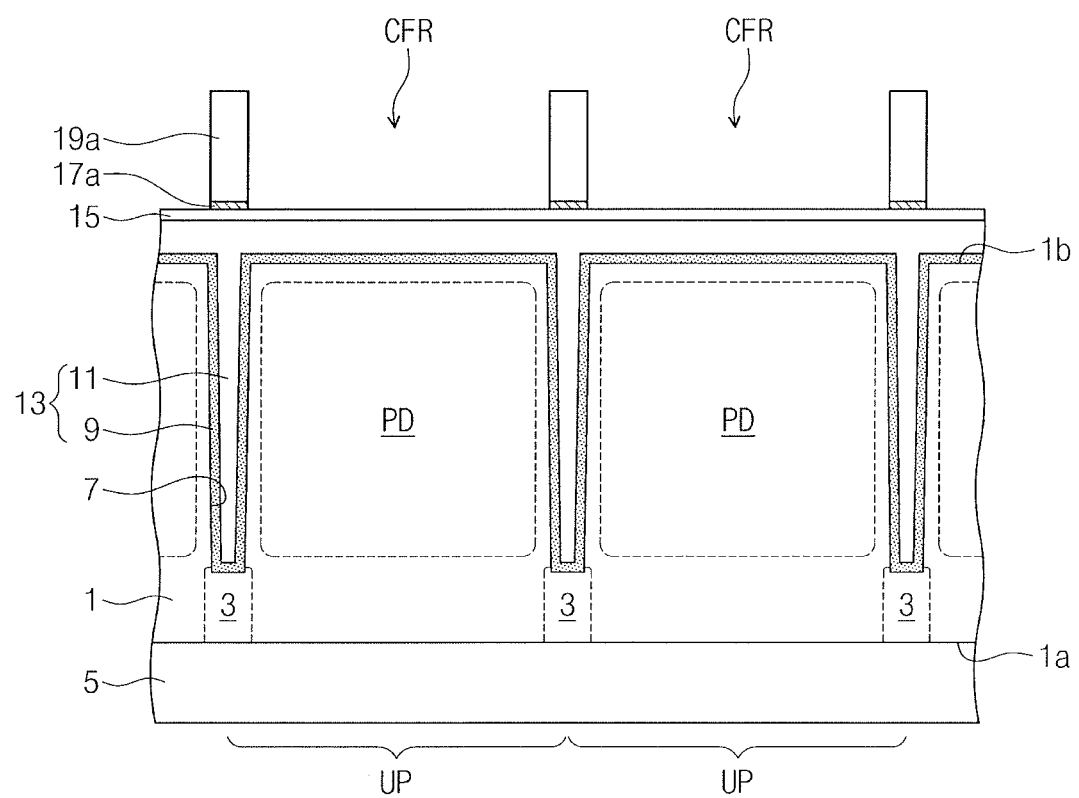

Referring to FIG. 3B, a mask pattern may be formed on the sacrificial layer 19. The mask pattern may include a photoresist pattern or any pattern whose material has an etch selectivity with respect to the sacrificial layer 19. The mask pattern may be used as an etching mask for an anisotropic etching process through which the sacrificial layer 19 and the light-shield layer 17 may be sequentially anisotropically etched to expose the subsidiary dielectric layer 15. These processes above may form sacrificial patterns 19a defining color filter regions CFR and also form light-shield patterns 17a below the sacrificial patterns 19a. In an implementation, the sacrificial patterns 19a and the light-shield patterns 17a may have grid shapes in a plan view.

Figure 3C:
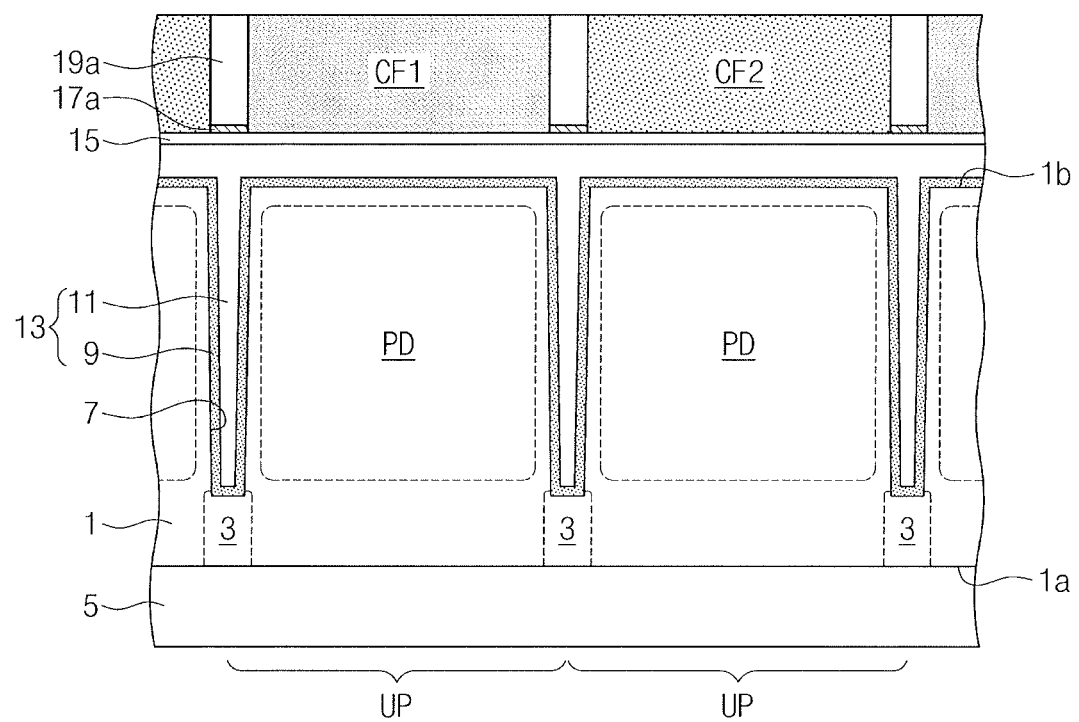

Referring to FIGS. 3B and 3C, first color filters CF1 and second color filters CF2 may be formed in corresponding color filter regions CFR. The first color filters CF1 and second color filters CF2 may be formed by performing a photolithography process several times. For example, the photolithography process may include a coating process, a soft bake process, an exposure process, a post bake process, a development process, and the like that are performed on a photoresist composition including a dye or pigment.

Figure 3D:
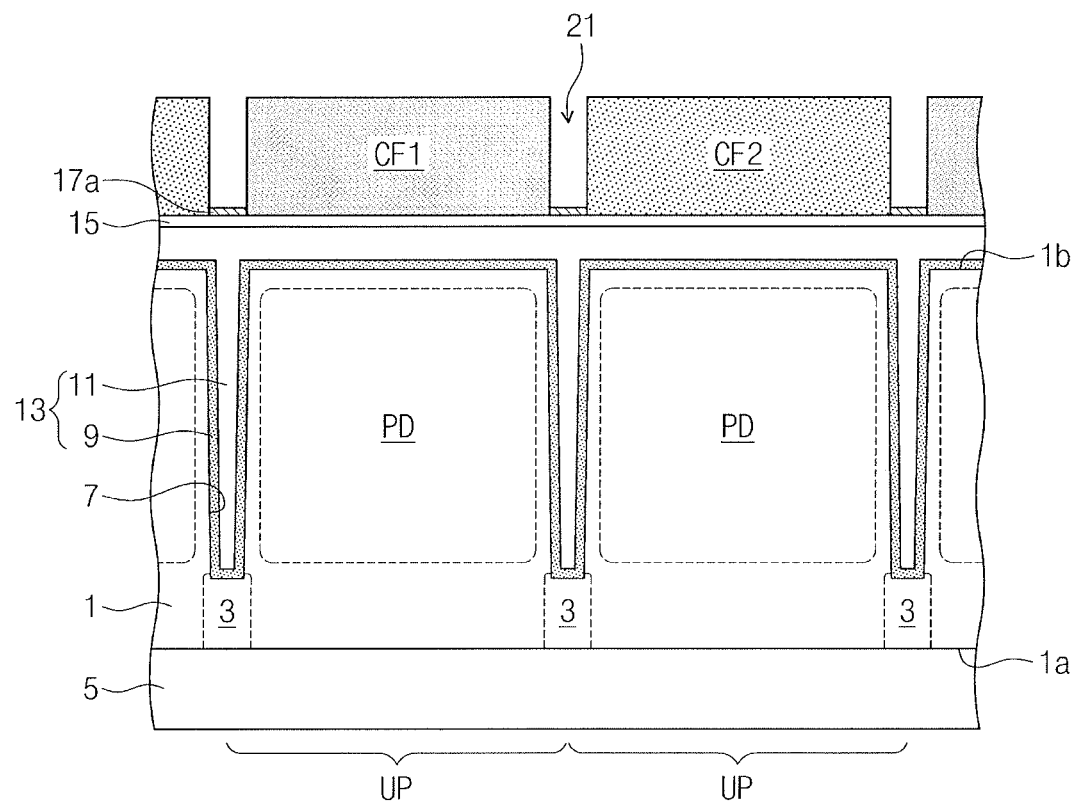

Referring to FIG. 3D, the sacrificial pattern 19a may be removed to expose a space 21 between the first color filters CF1 and second color filters CF2. When the sacrificial pattern 19a is formed of a silicon oxide layer, an etchant including, e.g., fluorine, may be used to remove the sacrificial pattern 19a. The space 21 may expose a top surface of the light-shield pattern 17a and sidewalls of the first color filters CF1 and second color filters CF2.

Figure 3E:
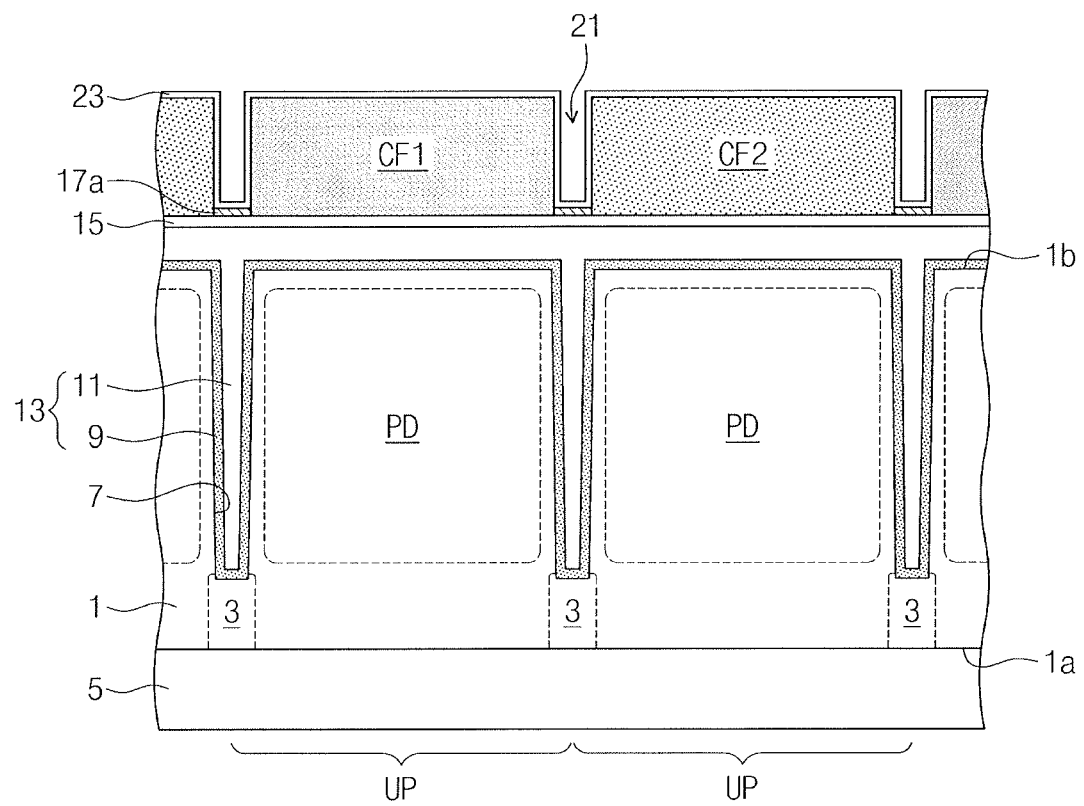

Referring to FIG. 3E, a protective layer 23 may be conformally formed on the entirety of the second surface 1b of the semiconductor substrate 1. The protective layer 23 may be formed to have a first thickness T1 as shown in FIG. 2B. The protective layer 23 may be formed as a single layer or multiple layers including, e.g., one or more of an aluminum oxide layer or a silicon oxycarbide layer. The protective layer 23 may be formed by chemical vapor deposition or atomic layer deposition. The protective layer 23 may be deposited at temperatures below about 200° C. to help prevent damage of the first color filters CF1 and second color filters CF2, each including an organic material. For example, when the protective layer 23 is formed of an aluminum oxide layer, the protective layer 23 may be deposited at a temperature of about 100° C. When the protective layer 23 is formed of a silicon oxycarbide layer, the protective layer 23 may be deposited at a temperature of about 150° C.

Figure 3F:
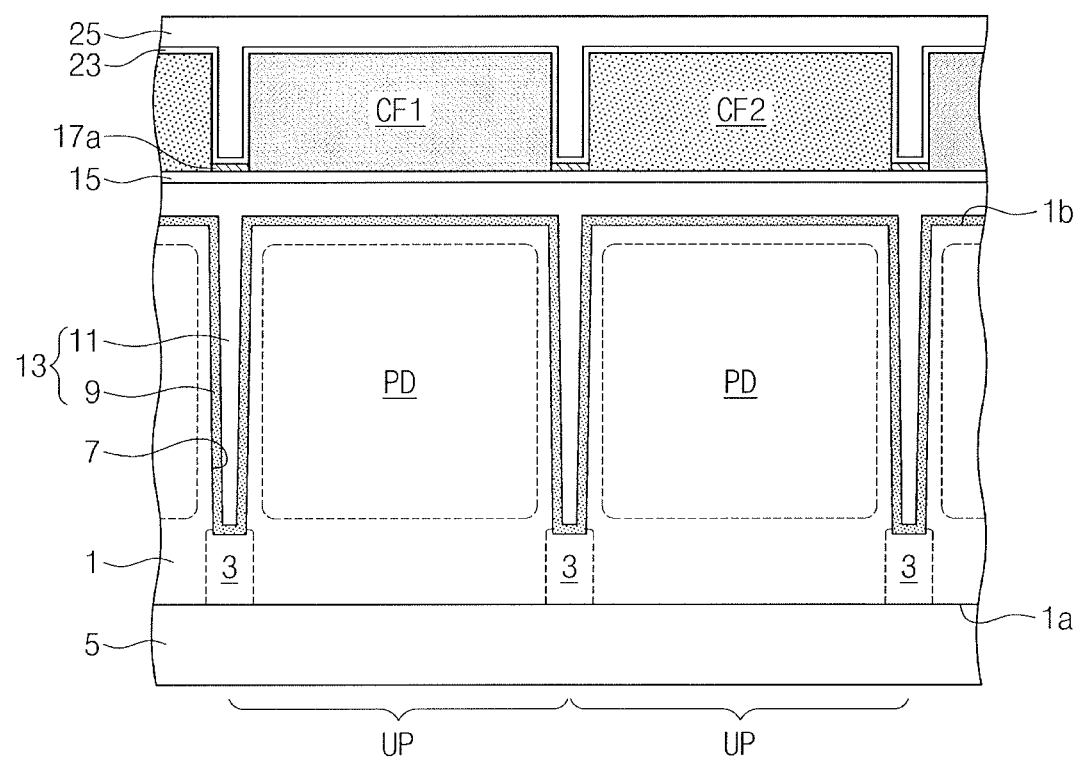

Referring to FIGS. 3E and 3F, a low-refractive layer 25 may be formed on the protective layer 23, thereby filling the space 21. The low-refractive layer 25 may include an organic material. For example, the formation of the low-refractive layer 25 may include performing a step in which a composition including an organic material and a solvent is spin-coated on the protective layer 23 and performing a step in which the solvent is removed by a soft bake process or a dry process.

Figure 3G:
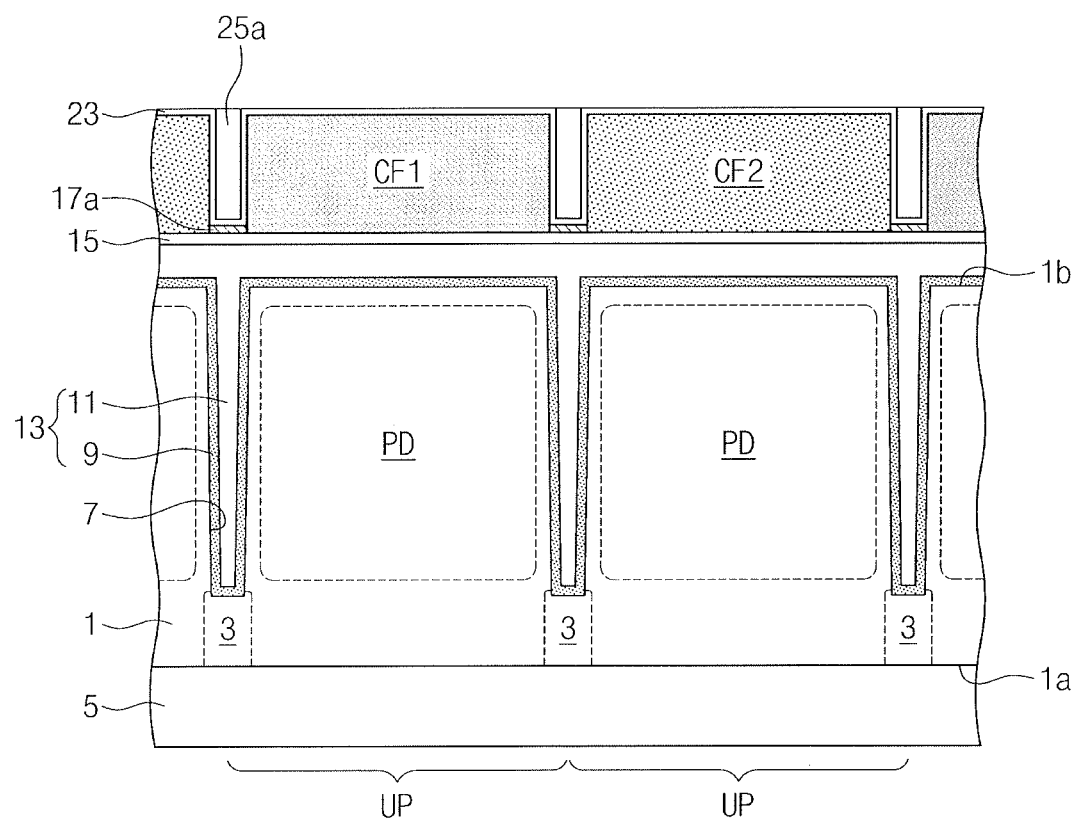

Referring to FIG. 3G, a blanket etch-back process or a polishing process may be performed to remove the low-refractive layer 25 from top surfaces of the color filters CF1 and CF2, such that the protective layer 23 may be exposed and a low-refractive pattern 25a may be formed between the first color filters CF1 and second color filters CF2. The protective layer 23 on the top surfaces of the first color filters CF1 and second color filters CF2 may also be partially etched to have a second thickness T2 as shown in FIG. 2B. In contrast, the protective layer 23 may not be etched between the color filters CF1 and CF2 and thus may maintain its initial first thickness T1. The second thickness T2 may be equal to or less than the first thickness T1. The protective layer 23 may help protect the first color filters CF1 and second color filters CF2 against damage. Subsequently, as shown in FIG. 1, micro-lenses ML may be formed on the protective layer 23.

In a method of fabricating an image sensor according to an embodiment, the sacrificial layer 19 may be formed of a silicon oxide layer or the like that is widely used for semiconductor fabrication, and accordingly it may be easy to select an etchant for deposition thickness adjustment and anisotropic etching process. In turn, the sacrificial pattern 19a having a grid shape may be formed with accurate critical dimensions, and thus the first color filters CF1 and second color filters CF2 may be formed at regular intervals. Furthermore, the sacrificial pattern 19a may have a desired thickness (or a determined thickness of the first color filters CF1 and second color filters CF2), and as a result, the first color filters CF1 and second color filters CF2 may be formed to have a desired profile.

If color filters were to be fabricated by forming a grid-shaped low-refractive pattern from a low-refractive layer instead of forming a sacrificial pattern from a silicon oxide layer, material characteristics of the low-refractive layer could make it difficult to form the low-refractive layer with a desired thickness and also difficult to perform an anisotropic etching process. In this case, it would be unlikely to form adequately profiled color filters and to form a refractive pattern with accurate critical dimensions.

In a method of fabricating an image sensor according to an embodiment, the sacrificial layer 19 and the light-shield layer 17 may be sequentially etched to form the sacrificial pattern 19a and the light-shield pattern 17a, and thereafter the sacrificial pattern 19a may be replaced with the low-refractive pattern 25a, with the result that the low-refractive pattern 25a and the light-shield pattern 17a may simply vertically overlap each other without misalignment. For example, an image sensor may be provided that is capable of increasing luminance efficiency and achieving sharp image quality.

Figure 4:
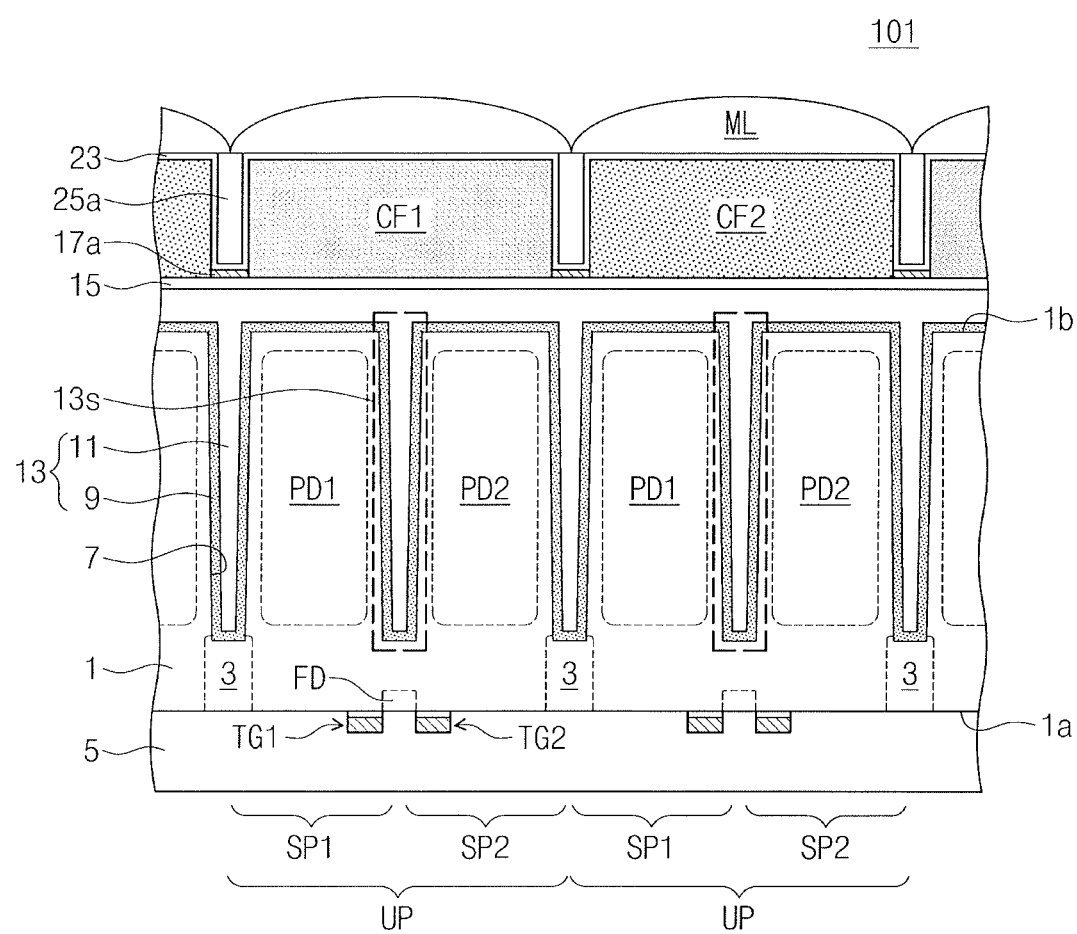
FIG. 4 illustrates a cross-sectional view of an image sensor according to some example embodiments.

FIG. 4 illustrates a cross-sectional view of an image sensor according to some example embodiments.

Referring to FIG. 4, an image sensor 101 according to the present embodiment may be, e.g., an auto-focus image sensor. In the image sensor 101, the deep device isolation section 13 may separate the unit pixel areas UP from each other, and a sub-deep device isolation section 13s may extend along the second direction D2 to divide each unit pixel area UP into a first sub-pixel area SP1 and a second sub-pixel area SP2 along the first direction D1. A first photoelectric conversion section PD1 may be in the semiconductor substrate 1 on or at the first sub-pixel area SP1. A second photoelectric conversion section PD2 may be in the semiconductor substrate 1 on or at the second sub-pixel area SP2.

The sub-deep device isolation section 13s may be between the first photoelectric conversion section PD1 and the second photoelectric conversion section PD2. The sub-deep device isolation section 13s may overlap a center of one of the color filters CF1 and CF2.

Like the deep device isolation section 13, the sub-deep device isolation section 13s may include the fixed charge layer 9 and the buried dielectric layer 11. The semiconductor substrate 1 may include, on, e.g., directly on and below, its first surface 1a, a first transfer gate electrode TG1 and a second transfer gate electrode TG2 that are spaced apart from each other along the first direction D1. The first transfer gate electrode TG1 may be in the first sub-pixel area SP1, and the second transfer gate electrode TG2 may be in the second sub-pixel area SP2. A floating diffusion region FD may be in the semiconductor substrate 1 between the first transfer gate electrode TG1 and the second transfer gate electrode TG2. Other configurations may be identical or similar to those discussed with reference to FIGS. 1, 2A, and 2B.

Figure 5:
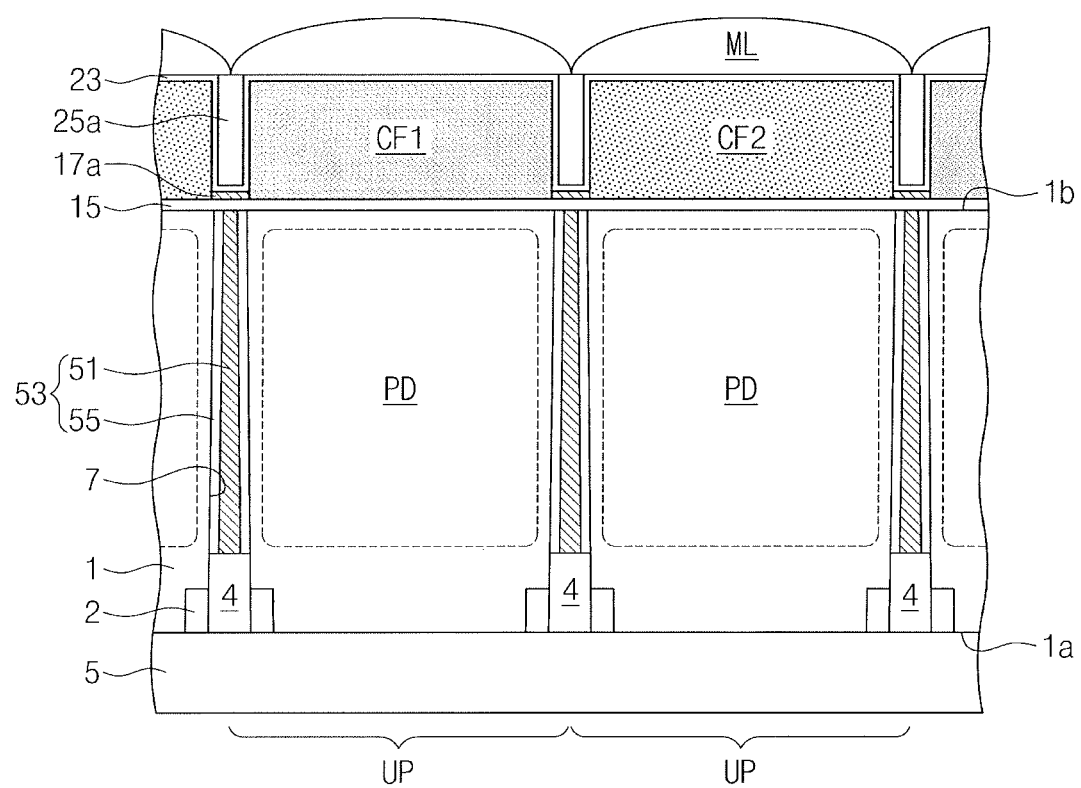
FIG. 5 illustrates a cross-sectional view of an image sensor according to some example embodiments.

FIG. 5 illustrates a cross-sectional view of an image sensor according to some example embodiments.

Referring to FIG. 5, an image sensor 102 according to the present embodiment may include a shallow device isolation section 2 adjacent to, e.g., directly on the first surface 1a of the semiconductor substrate 1. The shallow device isolation section 2 may define active regions for transistors on the first surface 1a. The shallow device isolation section 2 may be formed by a shallow trench isolation (SIT) process. The shallow device isolation section 2 may have a single-layered structure or multi-layered structure including one or more of a silicon oxide layer, a silicon nitride layer, and a silicon oxynitride layer. The deep trench 7 may penetrate the shallow device isolation section 2 and the semiconductor substrate 1. The deep trench 7 may have a width that decreases in a direction approaching the second surface 1b from the first surface 1a.

A deep device isolation section 53 may be in the deep trench 7. The deep device isolation section 53 may include an impurity-doped polysilicon pattern 51 and a dielectric layer 55 surrounding a sidewall of the polysilicon pattern 51. The deep device isolation section 53 may contact the subsidiary dielectric layer 15. The polysilicon pattern 51 may have a thermal expansion coefficient that is almost identical to that of the semiconductor substrate 1 made of single crystalline silicon, which may help reduce a physical stress caused by a difference in thermal expansion coefficient of materials. The polysilicon pattern 51 may serve as a common bias line. The polysilicon pattern 51 may be supplied with a negative voltage. For example, dark current characteristics may be improved due to holding of holes possibly present on a surface of the deep trench 7.

The subsidiary dielectric layer 15 may contact the second surface 1b of the semiconductor substrate 1, e.g., may be directly on the second surface 1b. The subsidiary dielectric layer 15 may include, e.g., a fixed charge layer, an antireflection layer, and a planarization layer that are sequentially stacked along the second direction D2, and the fixed charge layer may contact the second surface 1b. The first surface 1a of the semiconductor substrate 1 may be covered, e.g., completely covered, with the interlayer dielectric layer 5. The deep device isolation section 53 may be spaced apart from the interlayer dielectric layer 5 and the shallow device isolation section 2. The deep trench 7 may include a subsidiary buried dielectric layer 4 between the deep device isolation section 53 and the interlayer dielectric layer 5. The shallow device isolation section 2 may surround the subsidiary buried dielectric layer 4 and may be shorter along the first direction D1. Other configurations may be identical or similar to those discussed with reference to FIGS. 1, 2A, and 2B.

Figure 6:
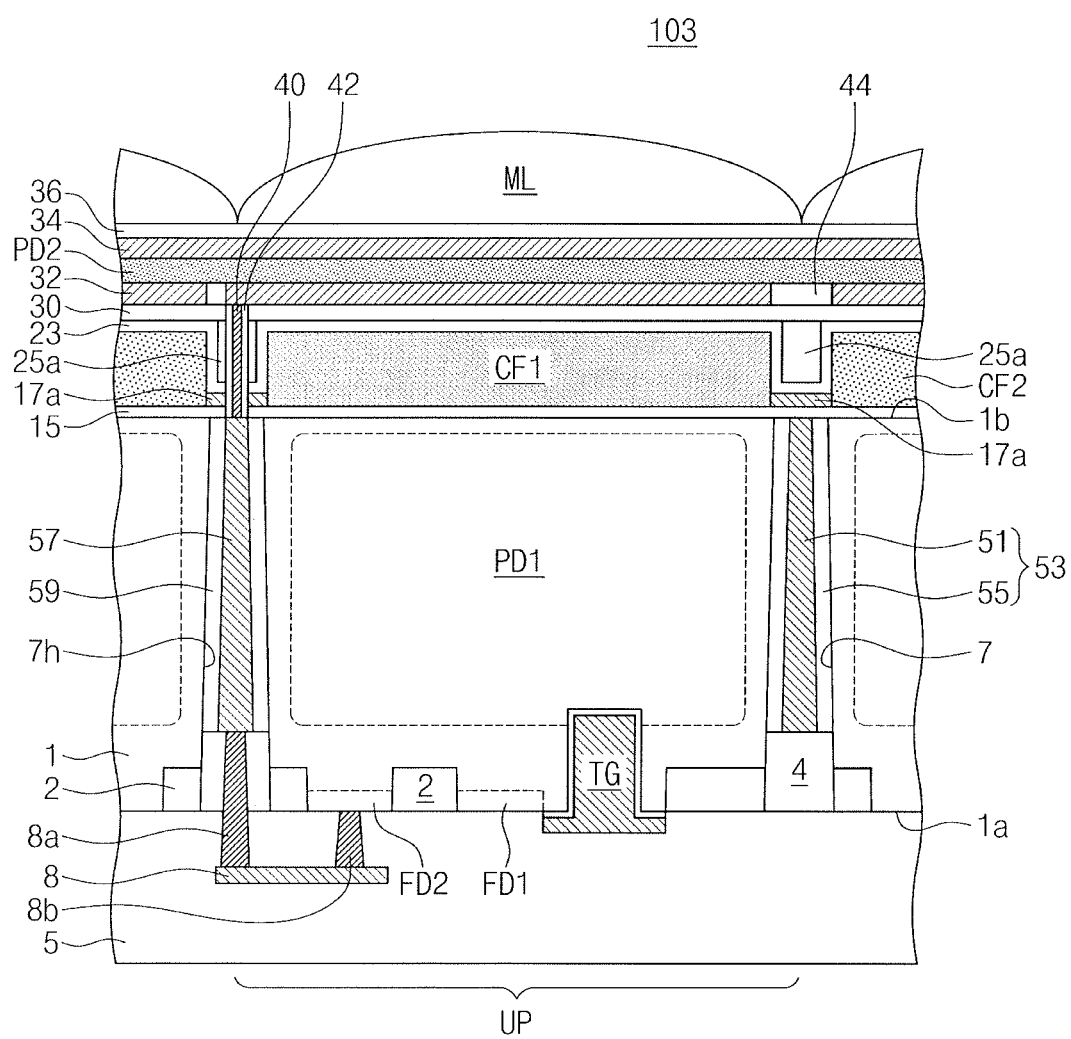
FIG. 6 illustrates a cross-sectional view of an image sensor according to some example embodiments.

FIG. 6 illustrates a cross-sectional view of an image sensor according to some example embodiments.

Referring to FIG. 6, an image sensor 103 according to the present embodiment may include a through electrode 57 in the semiconductor substrate 1. The through electrode 57 may be insulated from the polysilicon pattern 51 of the deep device isolation section 53. The through electrode 57 may be surrounded by a first via dielectric layer 59. The through electrode 57 and the first via dielectric layer 59 may be in a through electrode hole 7h in the semiconductor substrate 1. A transfer gate electrode TG may be on the first surface 1a of the semiconductor substrate 1.

The transfer gate electrode TG may extend along a portion of the first surface 1a of the semiconductor substrate 1 along the first direction D1 and may extend toward the second surface 1b of the semiconductor substrate 1 along the second direction D2. A first floating diffusion region FD1 may be in the semiconductor substrate 1 adjacent to the transfer gate electrode TG. The semiconductor substrate 1 may include a second floating diffusion region FD2 spaced apart from the first floating diffusion region FD1 along the first direction D1 across a shallow device isolation section 2 that does note surround the subsidiary buried dielectric layer 4. A first photoelectric conversion section PD1 may be in the semiconductor substrate 1 on or at each of the unit pixel areas UP.

The first photoelectric conversion section PD1 may be a region doped with impurities having the second conductive type.

The subsidiary dielectric layer 15 may be on the second surface 1b of the semiconductor substrate 1. The subsidiary dielectric layer 15 may include one of the color filters CF1 and CF2 thereon at each unit pixel area UP. The light-shield pattern 17a may be on the subsidiary dielectric layer 15 between the first color filters CF1 and second color filters CF2. The protective layer 23 may cover the top and sidewalls of the first color filters CF1 and second color filters CF2 and the top surface of the light-shield pattern 17a. The low-refractive pattern 25a may fill a space between the first color filters CF1 and second color filters CF2.

A first dielectric layer 30 may be on the protective layer 23 and the low-refractive pattern 25a. The first dielectric layer 30 may be a silicon oxide layer or a silicon nitride layer. A pixel electrode 32 may be on the first dielectric layer 30 at each unit pixel area UP. A second dielectric layer 44 may be between the pixel electrodes 32. The second dielectric layer 44 may be a silicon oxide layer or a silicon nitride layer. A second photoelectric conversion section PD2 may be on the pixel electrodes 32. A common electrode 34 may be on the second photoelectric conversion section PD2. A passivation layer 36 may be on the common electrode 34. The micro-lenses ML may be on the passivation layer 36.

The pixel electrode 32 and the common electrode 34 may include, e.g., indium tin oxide (ITO), indium zinc oxide (IZO), zinc oxide (ZnO), or an organic transparent conductive material. The second photoelectric conversion section PD2 may be, e.g., an organic photoelectric conversion layer. The second photoelectric conversion section PD2 may include a p-type organic semiconductor material and an n-type organic semiconductor material, which p-type and n-type organic semiconductor materials may form a p-n junction. In an implementation, the second photoelectric conversion section PD2 may include quantum dots or chalcogenide.

The pixel electrode 32 may be electrically connected through a via plug 40 to the through electrode 57. The via plug 40 may include impurity-doped polysilicon, a metal nitride layer such as a titanium nitride layer, a metallic material such as tungsten, titanium, and copper, or a transparent conductive material such as ITO. The via plug 40 may contact the through electrode 57, while penetrating the first dielectric layer 30, the low-refractive pattern 25a, the protective layer 23, the light-shield pattern 17a, and the subsidiary dielectric layer 15. A second via dielectric layer 42 may cover a sidewall of the via plug 40. The through electrode 57 may be electrically connected through, a first connector 8a, a connection line 8, and a second connector 8b to the second floating diffusion region FD2. Other configurations may be identical or similar to those discussed above with reference to FIG. 5.

According to an embodiment, an image sensor may include a low-refractive pattern (between color filters) that refracts light incident adjacently on edges of the color filters and allows the light to travel to a related pixel. For example, it may be possible to increase light-receiving efficiency and to raise a signal-to-noise ratio (SNR).

In addition, according to an embodiment, the image sensor may include a protective layer covering top surfaces and sidewalls of the color filters that helps prevent the color filters from absorbing moisture or being damaged during fabrication processes, which may result in an improvement in reliability.

Furthermore, the image sensor according to an embodiment may include a light-shield pattern to help prevent or prohibit bruise defects, and thus may achieve sharp image quality.

According to an embodiment, a method of fabricating an image sensor may use a sacrificial pattern by which color filter regions are limited or defined to inhibit color filters from having bad profiles and to accurately form color filters with desired sizes.

Moreover, according to an embodiment, the method of fabricating an image sensor may use a protective layer to help prevent damage to the color filters.

One or more embodiments may provide an image sensor that increases luminance efficiency.

One or more embodiments may provide a method of fabricating an image sensor, which method reduces process defects.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
    a plurality of color filters spaced apart from each other on a semiconductor substrate;
    a protective layer covering sidewalls and top surfaces of the color filters;
    a low-refractive pattern filling a space between the color filters; and
    a micro-lens on each of color filters,
    wherein the micro-lens is in contact with top surfaces of the protective layer and the low-refractive pattern.

2. The image sensor as claimed in claim 1, wherein the low-refractive pattern has a refractive index that is less than refractive indices of the color filters.

3. The image sensor as claimed in claim 1, wherein the protective layer includes one or more of an aluminum oxide layer and a silicon oxycarbide layer.

4. The image sensor as claimed in claim 1, wherein the protective layer has a thickness of about 1 Å to about 100 Å.

5. The image sensor as claimed in claim 1, further comprising a light-shield pattern on the semiconductor substrate and between the color filters,
wherein a top surface of the light-shield pattern is covered by the protective layer.

6. The image sensor as claimed in claim 5, wherein a sidewall of the light-shield pattern is aligned with a sidewall of one of the color filters.

7. The image sensor as claimed in claim 1, further comprising:
a through electrode in the semiconductor substrate;
a pixel electrode on the protective layer and overlapping the low-refractive pattern;
an organic photoelectric conversion layer on the pixel electrode; and
a via plug electrically connecting the pixel electrode to the through electrode,
wherein the via plug penetrates the low-refractive pattern and the protective layer.

8. The image sensor as claimed in claim 1, wherein a top surface of the protective layer is coplanar with a top surface of the low-refractive pattern.

9. The image sensor as claimed in claim 1, wherein:
a portion of the protective layer on the sidewalls of the color filters has a first thickness,
a portion of the protective layer on the top surfaces of the color filters has a second thickness, and
the first thickness is equal to or greater than the second thickness.

10. An image sensor, comprising:
a semiconductor substrate having a plurality of unit pixel areas;
a deep device isolation section between the unit pixel areas;
a photoelectric conversion section in the semiconductor substrate of each of the unit pixel areas;
a plurality of color filters spaced apart from each other on the semiconductor substrate;
a light-shield pattern on the semiconductor substrate and between the color filters, the light-shield pattern having a thickness that is less than a thickness of each of the color filters;
a low-refractive pattern filling a space between the color filters; and
a protective layer between facing surfaces of the low-refractive pattern and the color filters and between facing surfaces of the low-refractive pattern and the light-shield pattern.

11. The image sensor as claimed in claim 10, wherein the protective layer contacts top surfaces of the color filters.

12. The image sensor as claimed in claim 11, wherein a top surface of the protective layer is coplanar with a top surface of the low-refractive pattern.

13. The image sensor as claimed in claim 11, wherein:
a portion of the protective layer on sidewalls of the color filters has a first thickness,
a portion of the protective layer on the top surfaces of the color filters has a second thickness, and
the first thickness is equal to or greater than the second thickness.

14. The image sensor as claimed in claim 10, wherein a sidewall of the light-shield pattern is aligned with a sidewall of one of the color filters.

15. An image sensor, comprising:
a plurality of optical filters spaced apart from each other on a semiconductor substrate;
a low-refractive pattern filling a space between the optical filters;
a light-shield pattern between the low-refractive pattern and the semiconductor substrate; and
a protective layer between facing surfaces of the low-refractive pattern and the light-shield pattern.

16. The image sensor as claimed in claim 15, wherein a thickness of the light-shield pattern is less than a thickness of the low-refractive pattern.

17. The image sensor as claimed in claim 15, wherein:
the protective layer is between the low-refractive pattern and the optical filters, the protective layer covering top surfaces of the optical filters,
a portion of the protective layer on sidewalls of the optical filters has a first thickness,
a portion of the protective layer on the top surfaces of the optical filters has a second thickness, and
the first thickness is equal to or greater than the second thickness.

18. The image sensor as claimed in claim 17, wherein a top surface of the protective layer is coplanar with a top surface of the low-refractive pattern.

19. The image sensor as claimed in claim 15, wherein a sidewall of the light-shield pattern is aligned with a sidewall of one of the optical filters.

* * * * *